(12) United States Patent
Chen et al.

(10) Patent No.: US 11,293,945 B1
(45) Date of Patent: Apr. 5, 2022

(54) PORTABLE PROBE STAND ASSEMBLY

(71) Applicants: Kuan-Hung Chen, Taichung (TW);
Li-Cheng Richard Zai, Taipei (TW)

(72) Inventors: Kuan-Hung Chen, Taichung (TW);
Li-Cheng Richard Zai, Taipei (TW)

( * ) Notice: Subject to any disclaimer, the term of this patent is extended or adjusted under 35 U.S.C. 154(b) by 13 days.

(21) Appl. No.: 16/953,898

(22) Filed: Nov. 20, 2020

(51) Int. Cl.
*G01R 1/067* (2006.01)
*G01R 1/073* (2006.01)
*F16M 11/10* (2006.01)
*F16M 11/04* (2006.01)

(52) U.S. Cl.
CPC ....... *G01R 1/06705* (2013.01); *F16M 11/041* (2013.01); *F16M 11/10* (2013.01); *F16M 2200/041* (2013.01)

(58) Field of Classification Search
CPC .............. G01R 1/06705; G01R 1/067
See application file for complete search history.

(56) References Cited

U.S. PATENT DOCUMENTS

2018/0172731 A1* 6/2018 Lu ................... G01R 31/2601

* cited by examiner

*Primary Examiner* — Minh Q Phan
(74) *Attorney, Agent, or Firm* — Osha Bergman Watanabe & Burton LLP

(57) ABSTRACT

A portable probe stand assembly including a hand-held frame, a gravity tilt unit, and a probe holder. The hand-held frame includes a frame body with a cut-out and two gripping handles. The gravity tilt unit includes a movable part that has a pivot portion rotatably connected to the hand-held frame. The movable part tends to pivot due to gravity to turn the portable probe stand assembly to a hand-held state where a portion of an underside abutting surface of the movable part is disposed out of the cut-out. The portable probe stand assembly is convertible from the hand-held state to a usage state where the movable part is leveled via a pivot movement of the movable part upon engaging the underside abutting surface with a surface of an object.

13 Claims, 19 Drawing Sheets

PORTABLE PROBE STAND ASSEMBLY

FIELD

The disclosure relates to a printed circuit board measurement device, more particularly to a portable probe stand assembly.

BACKGROUND

Referring to FIGS. 1 and 2, an existing probe stand 1 includes a guide rail arrangement 11 and a probe holder 12. The guide rail arrangement 11 includes two parallel Y-axis rails 111 and an X-axis rail 112 perpendicular to and connected with the Y-axis rails 111 at two ends respectively. The probe holder 12 is provided for holding a probe set 13 that is adapted to measure a circuit board 9 and is movably disposed on the guide rail arrangement 11.

In the process of measurement, the probe holder 12 should first be moved on the Y-axis rails 111 and the X-axis rail 112 to a measurement position of the circuit board 9, and then the probe holder 12 is lowered down to contact the circuit board 9 for measurement. This operation is inconvenient and time-consuming since each time before performing measurement in a different area of the circuit board 9, the probe holder 12 or the X-axis rail 112 must be re-located and/or adjusted before the probe set 13 is put down to contact the circuit board 9. In addition, if it fails to draw the probe set 13 back from the printed circuit board 9 after completing a measurement, and the probe holder 12 is moved to the next location as it was, the probe set 13 may hit the circuit board 9 so that damage could be incurred to the probe set 13 or the circuit board 9 could be scratched, thus resulting in a considerable damage rate.

SUMMARY

Therefore, the object of the present invention is to provide a portable probe stand assembly that is easy to operate and can reduce the damage rate.

According to the disclosure, the portable probe stand assembly includes a hand-held frame, a gravity tilt unit, and a probe holder. The hand-held frame includes a frame body and two gripping handles. The frame body extends in a front-rear direction and is formed with a cut-out extending therethrough in an up-down direction which is substantially perpendicular to the front-rear direction. The gripping handles are connected to the frame body, are arranged in a left-right direction which is substantially perpendicular to the front-rear direction and the up-down direction, and are disposed respectively at opposite sides of the cut-out. The gravity tilt unit includes a movable part that is disposed between and connected to the gripping handles of the hand-held frame. The movable part has a pivot portion that is connected rotatably to the gripping handles and that serves as a pivot of the movable part, a front end portion that is positioned in front of the pivot portion, a rear end portion that is positioned in the rear of the pivot portion, and an underside abutting surface that is disposed under the front end portion. A distance between the pivot portion and the front end portion is shorter than that between the pivot portion and the rear end portion such that the movable part tends to pivot due to gravity to a position where a portion of the underside abutting surface under the rear end portion is disposed out of the cut-out of the frame body of the hand-held frame. The probe holder is supported co-movably on the movable part, and includes a probe mount that is disposed higher than the movable part and that projects forwardly. The portable probe stand assembly is convertible between a hand-held state where the movable part pivots with the portion of the underside abutting surface which is under the rear end portion being disposed out of the cut-out of the frame body of the hand-held frame, and a usage state, where the movable part is leveled via a pivot movement about the pivot portion thereof upon engaging the underside abutting surface with a surface of an object, thereby driving the probe mount to move downwardly.

BRIEF DESCRIPTION OF THE DRAWINGS

Other features and effects of the present invention will be clearly presented in the embodiments with reference to the drawings, in which.

DETAILED DESCRIPTION

Figure 1:
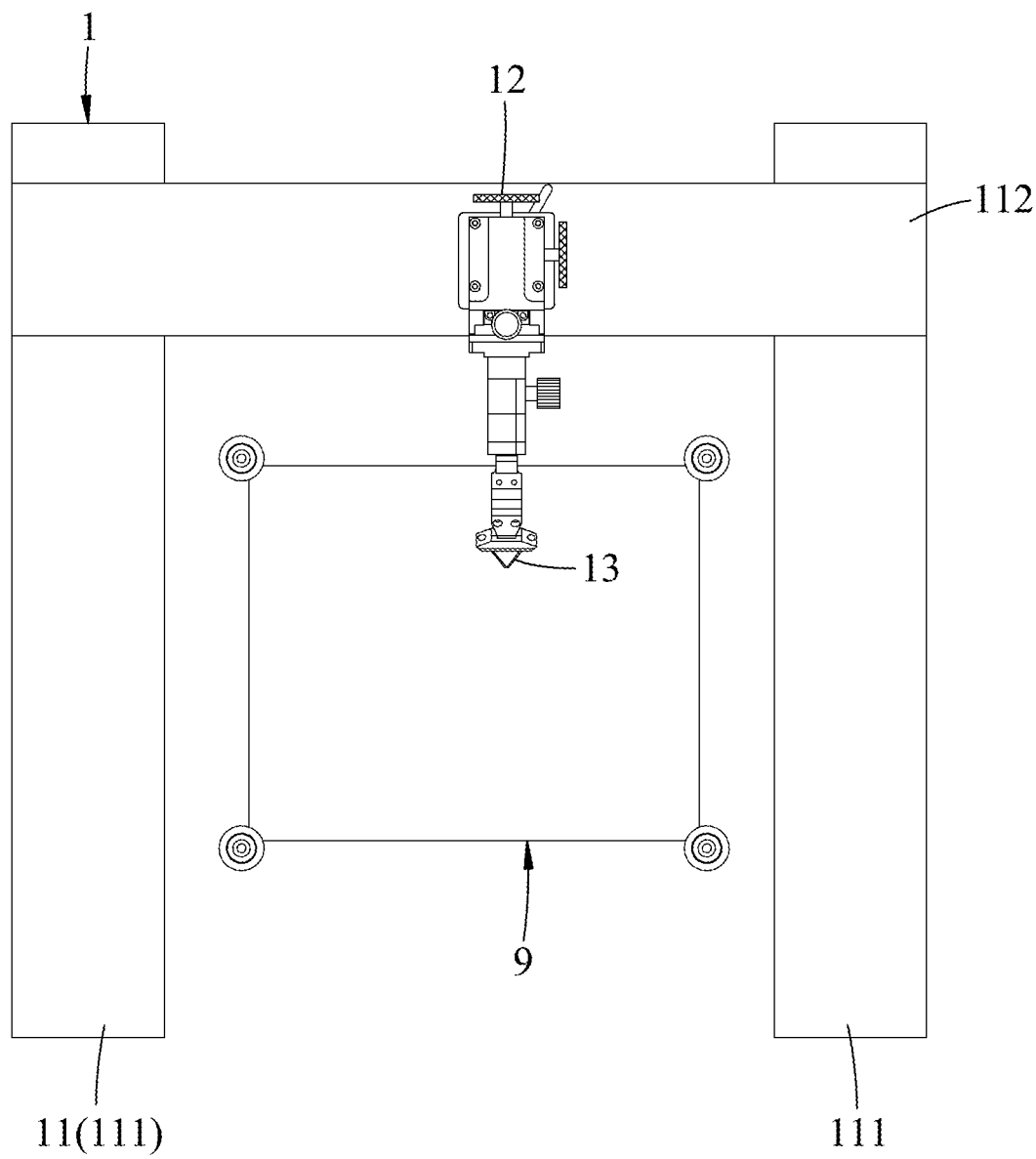
FIG. 1 is a top view of an existing probe stand used in measuring a circuit board.
Figure 2:
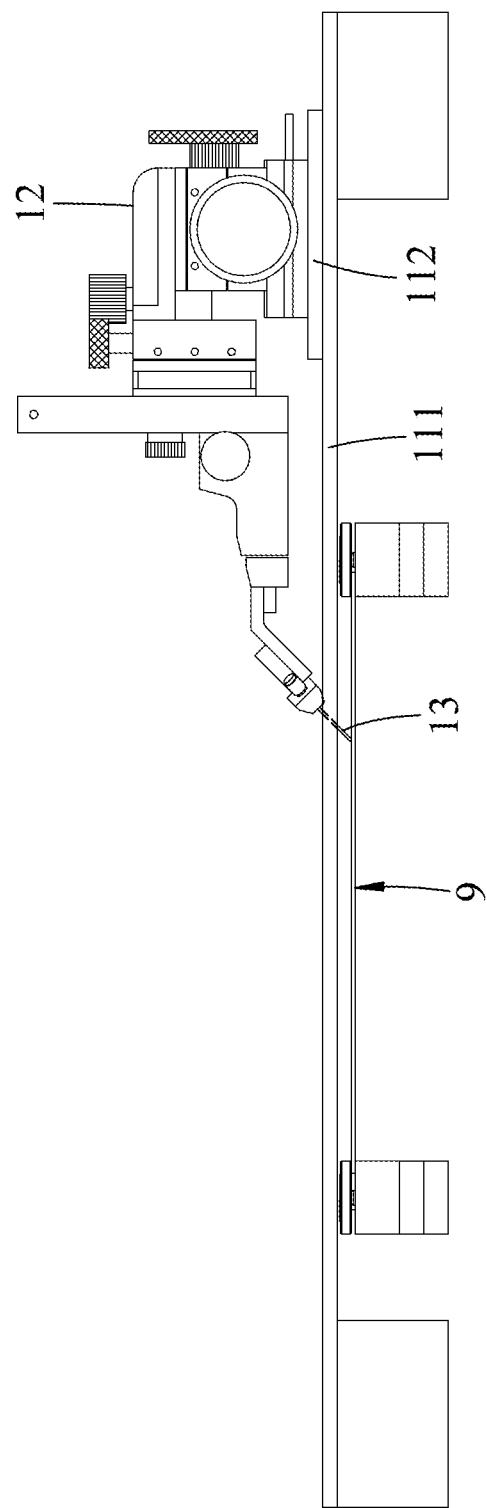
FIG. 2 is a side view of FIG. 1.

Before the present invention is described in greater detail, it should be noted that where considered appropriate, reference numerals or terminal portions of reference numerals have been repeated among the figures to indicate corresponding or analogous elements, which may optionally have similar characteristics.

Figure 3:
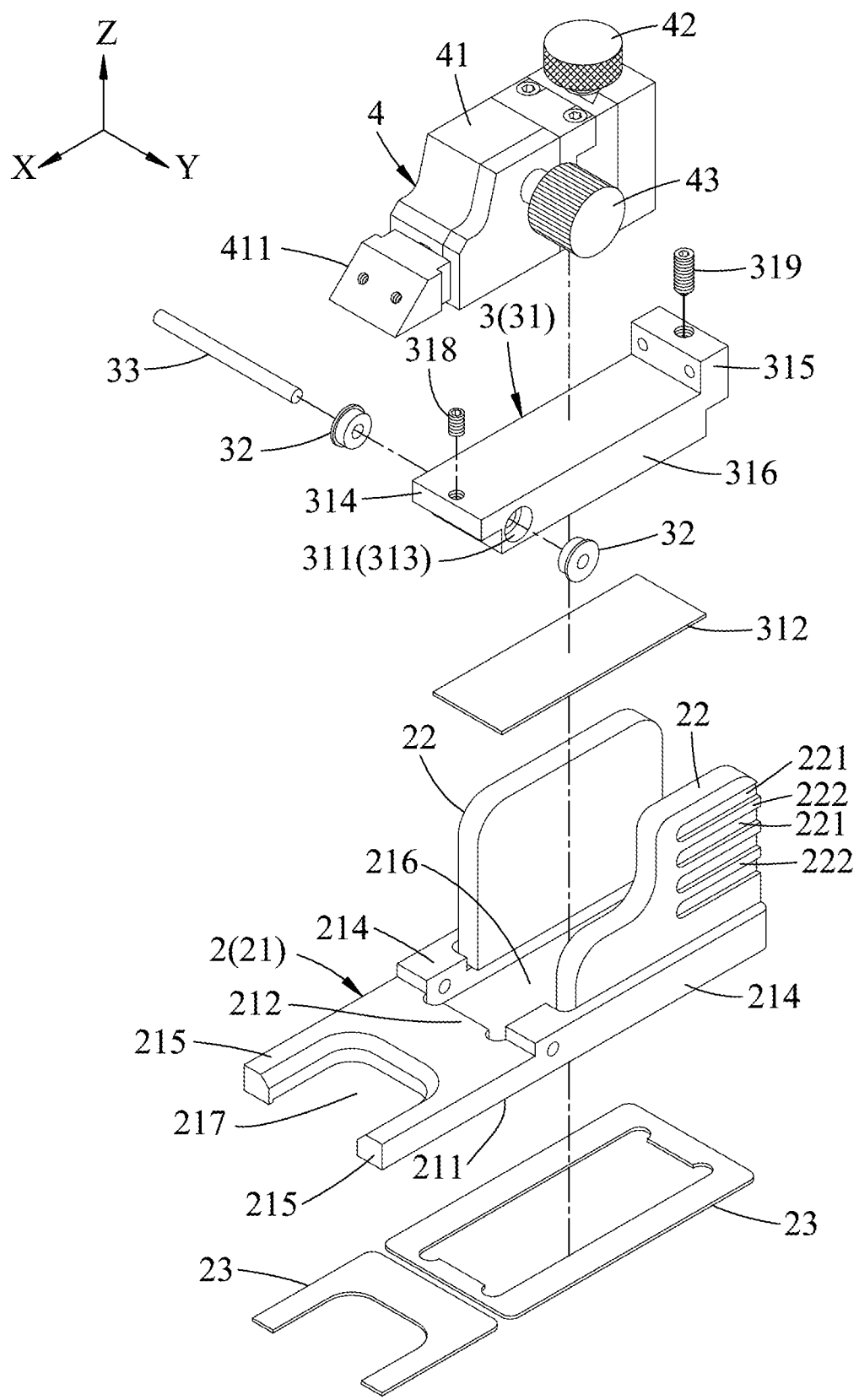
FIG. 3 is an exploded perspective view of a first embodiment of the portable probe stand assembly according to the disclosure.
Figure 4:
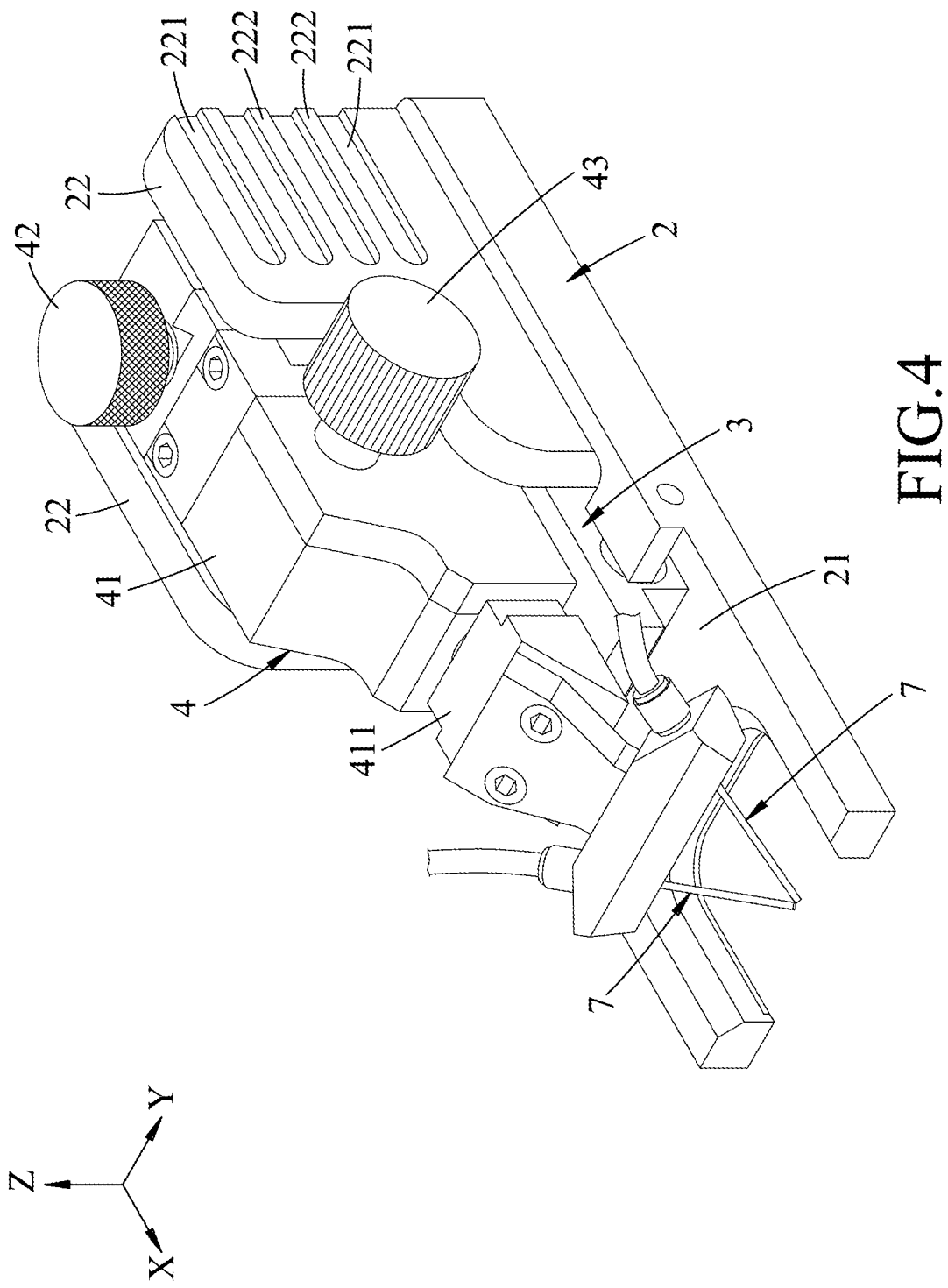
FIG. 4 is an assembled perspective view of the first embodiment used with a two-needle electrical measurement probe.
Figure 5:
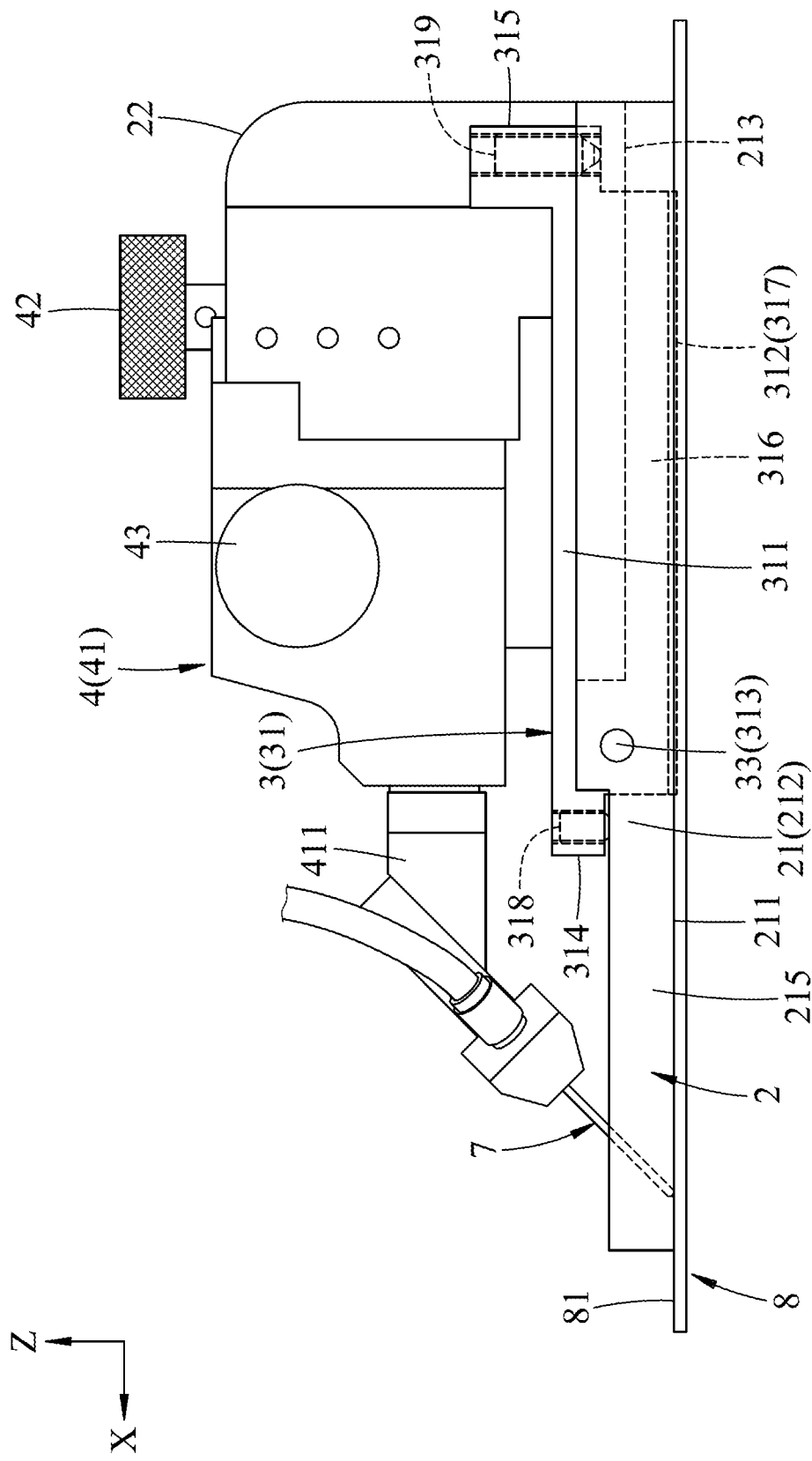
FIG. 5 is a fragmentary schematic side view, illustrating the first embodiment that is placed on a printed circuit board and that is in a usage state.

As shown in FIGS. 3, 4 and 5, a first embodiment of the portable probe stand assembly is used with a two-needle electrical measurement probe 7, and can be placed on a surface 81 of a printed circuit board 8 for electrical measurement. The portable probe stand assembly includes a hand-held frame 2, a gravity tilt unit 3, and a probe holder 4.

The hand-held frame 2 includes a frame body 21 extending in a front-rear direction (X), and two gripping handles 22 connected to the frame body 21 and arranged in a left-right direction (Y) which is substantially perpendicular to the front-rear direction (X). The hand-held frame 2 further includes two anti-slip strips 23 attached to the frame body 21. The frame body 21 has a bottom surface 211 to which the two anti-slip strips 23 are attached in order to prevent slippage of the frame body 21. In the first embodiment, the anti-slip strips 23 are disposed adjacent to each other in the front-rear direction (X), however, in other embodiments, the number of the anti-slip strip 23 may either be one or more than three. In this embodiment, each gripping handle 22 is in the shape of a plate. In addition, to increase the frictional force when holding, each gripping handle 22 has a plurality of ribs 222 formed at intervals on an outer side thereof, and a plurality of longitudinal grooves 221 alternately arranged with the ribs 222 in an up-down direction (Z) which is substantially perpendicular to the front-rear direction (X) and the left-right direction (Y).

Figure 6:
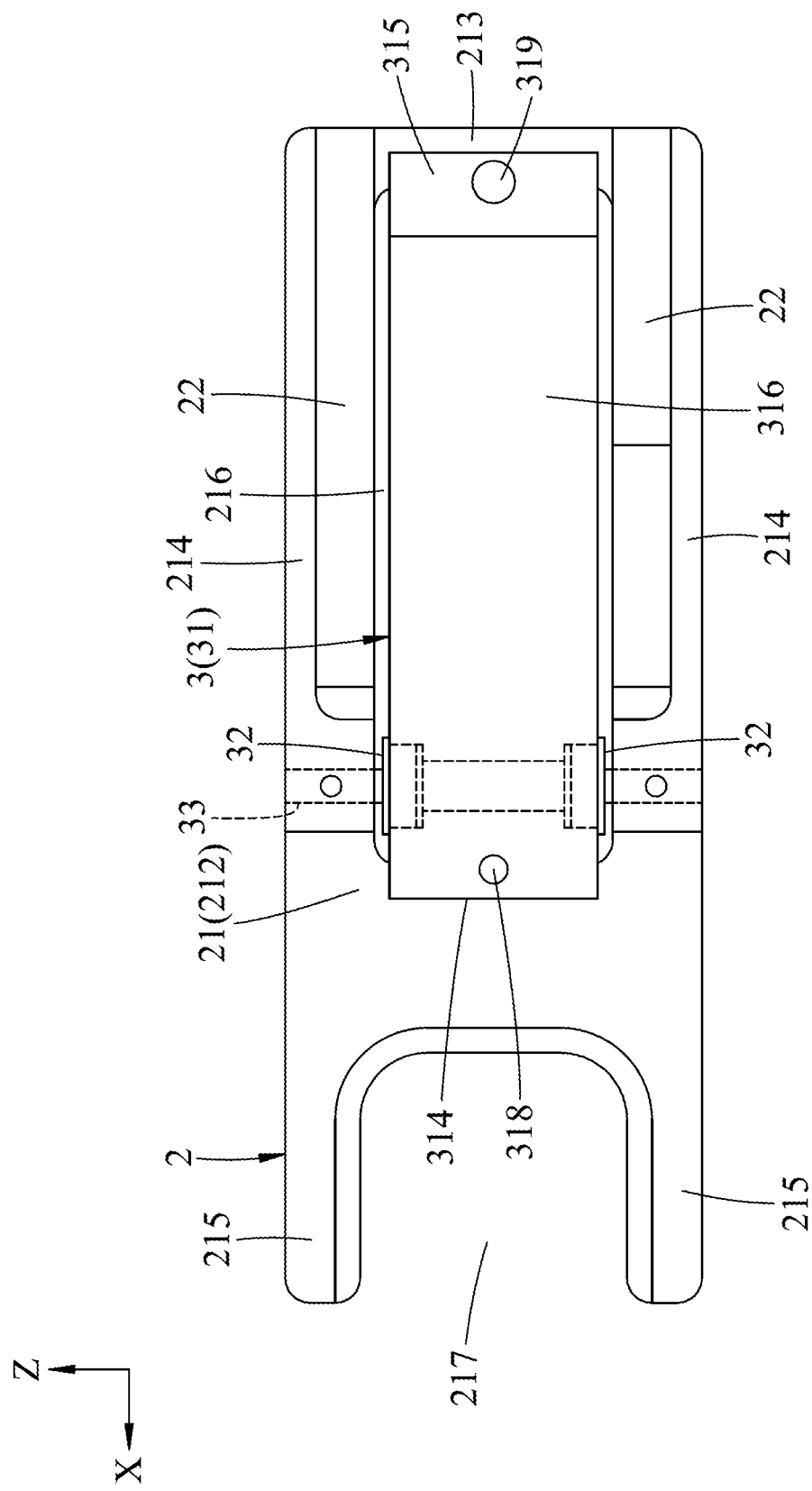
FIG. 6 is a schematic top view of the first embodiment.

Referring to FIGS. 3, 5 and 6, the frame body 21 has a front section 212, a rear section 213, two lateral sections 214, and two guard arm sections 215. The front and rear sections 212, 213 are opposite to each other in the front-rear direction (X). The lateral sections 214 are spaced apart from each other in the left-right direction (Y), and are connected between the front section 212 and the rear section 213. The gripping handles 22 are connected respectively to the lateral sections 214 of the frame body 22. The lateral sections 214 cooperate with the front and rear sections 212, 213 to define an cut-out 216 thereamong (i.e., the gripping handles 22 are disposed respectively at opposite sides of the cut-out 216). The two guard arm sections 215 extend forwardly from the front section 212 and are spaced apart from each other in the left-right direction (Y). A measurement through opening 217 is defined between the two guard arm sections 215.

The gravity tilt unit 3 includes a movable part 31 disposed between and connected to the two gripping handles 22 of the hand-held frame 2. The movable part 31 includes a slab 311 and a non-slip strip 312 attached on a bottom side of the slab 311. The slab 311 is substantially stepped contoured, and has a pivot portion 313 engaged with the cut-out 216, connected rotatably to the gripping handles 22, and serves as a pivot of the movable part 31. The slab 311 further has a front end portion 314 that is positioned in front of the pivot portion 313 and that is adjacent to the front section 212 of the frame body 21 of the hand-held frame 2, a rear end portion 315 that is positioned in the rear of the pivot portion 313 and that is adjacent to the rear section 213 of the frame body 21 of the hand-held frame 2, and an intermediate connecting portion 316 that is disposed between the front end portion 314 and the rear end portion 315. The non-slip strip 312 has an underside abutting surface 317 opposite to the slab 311 (i.e., the abutting surface 317 is disposed under the front end portion 314, the pivot end portion 313, the intermediate connecting portion 316 and the rear end portion 315). The bearings 32 are respectively disposed on left and right sides of the pivot portion 313, and the axle 33 transversely passes in the left-right direction (Y) through the lateral sections 214 of the frame body 21 of the hand-held frame 2, the pivot portion 313 of the movable part 31 and the bearings 32, so that the movable part 31 is rotatable about the axle 33. A distance between the pivot portion 313 and the front end portion 314 is shorter than that between the pivot portion 313 and the rear end portion 315 such that, when the probe stand assembly of the disclosure is lifted by a user, the movable part 31 tends to pivot due to gravity to a position where a portion of the underside abutting surface 317 under the rear end portion 315 is disposed out of the cut-out 216 of the frame body 21 of the hand-held frame 2, thereby turning the portable probe stand assembly to a hand-held state (see FIG. 7).

Referring to FIGS. 3, 4 and 5, the probe holder 4 is supported co-movably on the movable part 31. The probe holder 4 includes a probe mount 41, a vertical adjustment knob 42, and an angular adjustment knob 43. The probe mount 41 is disposed above the front section 212 of the hand-held frame 2 and the movable part 31 of the gravity tilt unit 3, and projects forwardly. The probe mount 41 has a swivel head 411 that is disposed on the front side for fixing the electrical measurement probe 7 and that is capable of rotating clockwise or counter-clockwise. With this arrangement, the electrical measurement probe 7 can be extended into the measurement through opening 217. In the first embodiment, the electrical measurement probe 7 is a differential probe with two needles. However, in other variations, a single-needle probe 7 may be utilized and mounted on the swivel head 411 of the probe mount 41. The vertical adjustment knob 42 is operable for moving the probe mount 41 linearly in the up-down direction (Z), and the angular adjustment knob 43 is operable for moving the swivel head 411 to rotate clockwise or counter-clockwise relative to a central axis thereof. Therefore, the electrical measurement probe 7 can be fine-tuned up, down, and angularly after placing in a predetermined position.

Figure 7:
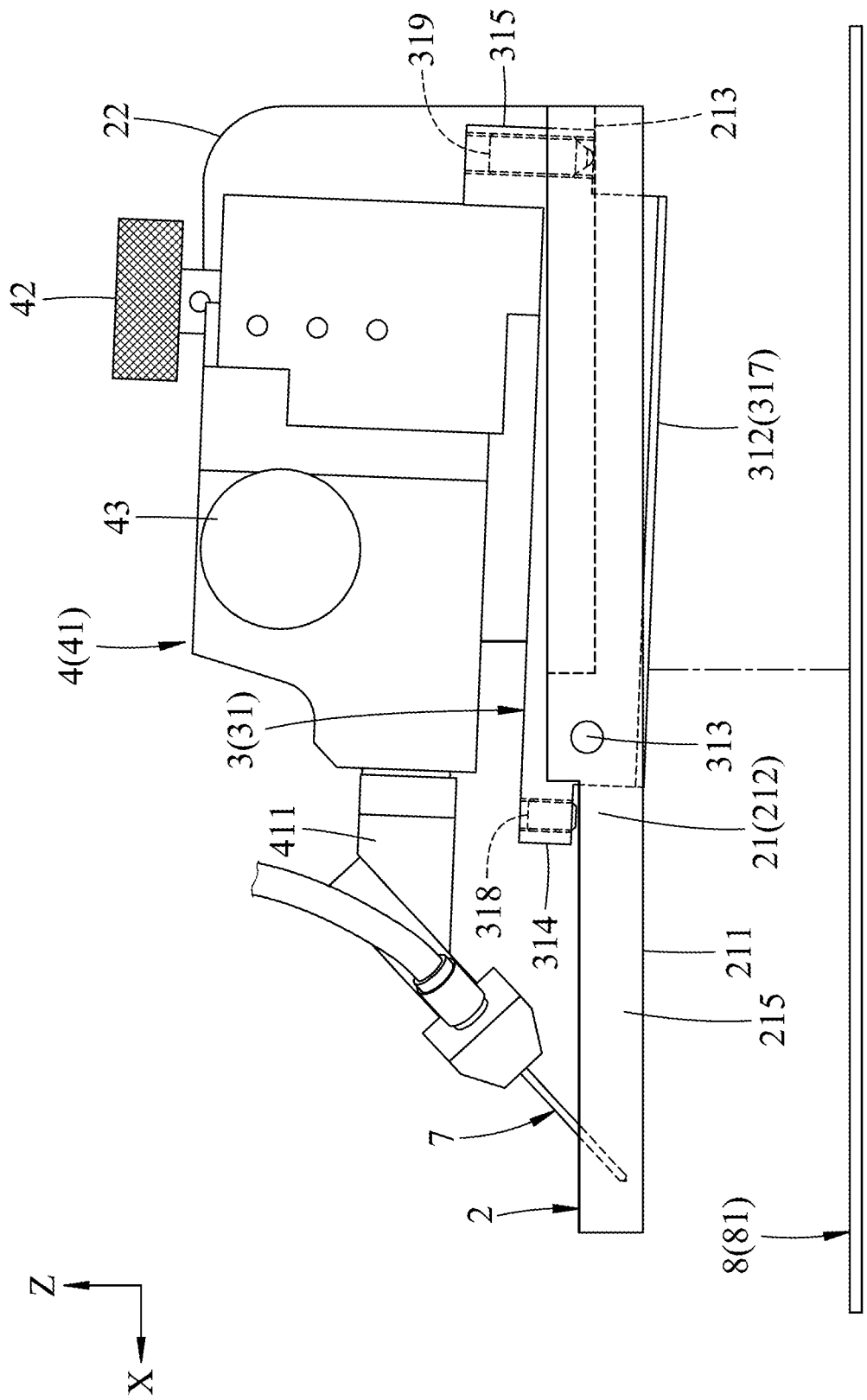
FIG. 7 is a fragmentary schematic side view illustrating the first embodiment is lifted away from the printed circuit board and converted to a hand-held state.

The electrical measurement probe 7 of the first embodiment is located between the two guard arms 215, so as to avoid hitting of the electrical measurement probe 7 when moving the portable probe stand assembly. Referring to FIGS. 5 and 7, the portable probe stand assembly is convertible between the hand-held state, as shown in FIG. 7, and a usage state, as shown in FIG. 5. In the hand-held state, the movable part 31 tilts due to gravity, with the rear end portion 315 of the slab 311 going down and the front end portion 314 of the slab 311 going up, and the probe holder 4 tilts with the movable part 31 at the same angle. At this time, the electrical measurement probe 7 moves toward a direction away from the bottom surface 211 of the frame body 21. As shown in FIG. 5, when the portable probe stand assembly is placed on the surface 81 of the printed circuit board 8, upon engaging the underside abutting surface 317 of the movable part 31 with the surface 81 of the printed circuit board 8, the portable probe stand assembly is converted to the usage state through pivot movement of the movable part 31 which makes the rear end portion 315 going up and the front end portion 314 going down, such that the movable part 31 is leveled and the two needles of the electrical measurement probe 7 are made to contact the printed circuit board 8.

Before performing the electrical measurement, the hand-held frame 2 is manually transported to a position above the area of the printed circuit board 8 to be measured, then placed on the surface 81 of the printed circuit board 8 to allow the portable probe stand assembly to be converted to the usage state where the electrical measurement probe 7 is capable of contacting the surface 81 of the printed circuit board 8 for measurement. In case there is a gap between the electrical measurement probe 7 and the printed circuit board 8, the vertical adjustment knob 42 and the angular adjustment knob 43 of the probe holder 4 can be used to adjust the electrical measurement probe 7 vertically and angularly to properly contact the surface 81 of the printed circuit board 8 for electrical measurement. It should be noted that, regardless of the number of the needle of the electrical measurement probe 7 being one or two, as long as the vertical adjustment knob 42 and the angular adjustment knob 43 are for the first time adjusted to make contact of the electrical measurement probe 7 with the printed circuit board 8, when moved to the next measurement point, there is no need to re-adjust the vertical and horizontal positions of the electrical measurement probe 7. When multi-point measurement is required for the printed circuit board 8, or measurement of the printed circuit board 8 is required in mass production, the presently disclosed portable probe stand assembly is more convenient and time-saving in operation.

Figure 8:
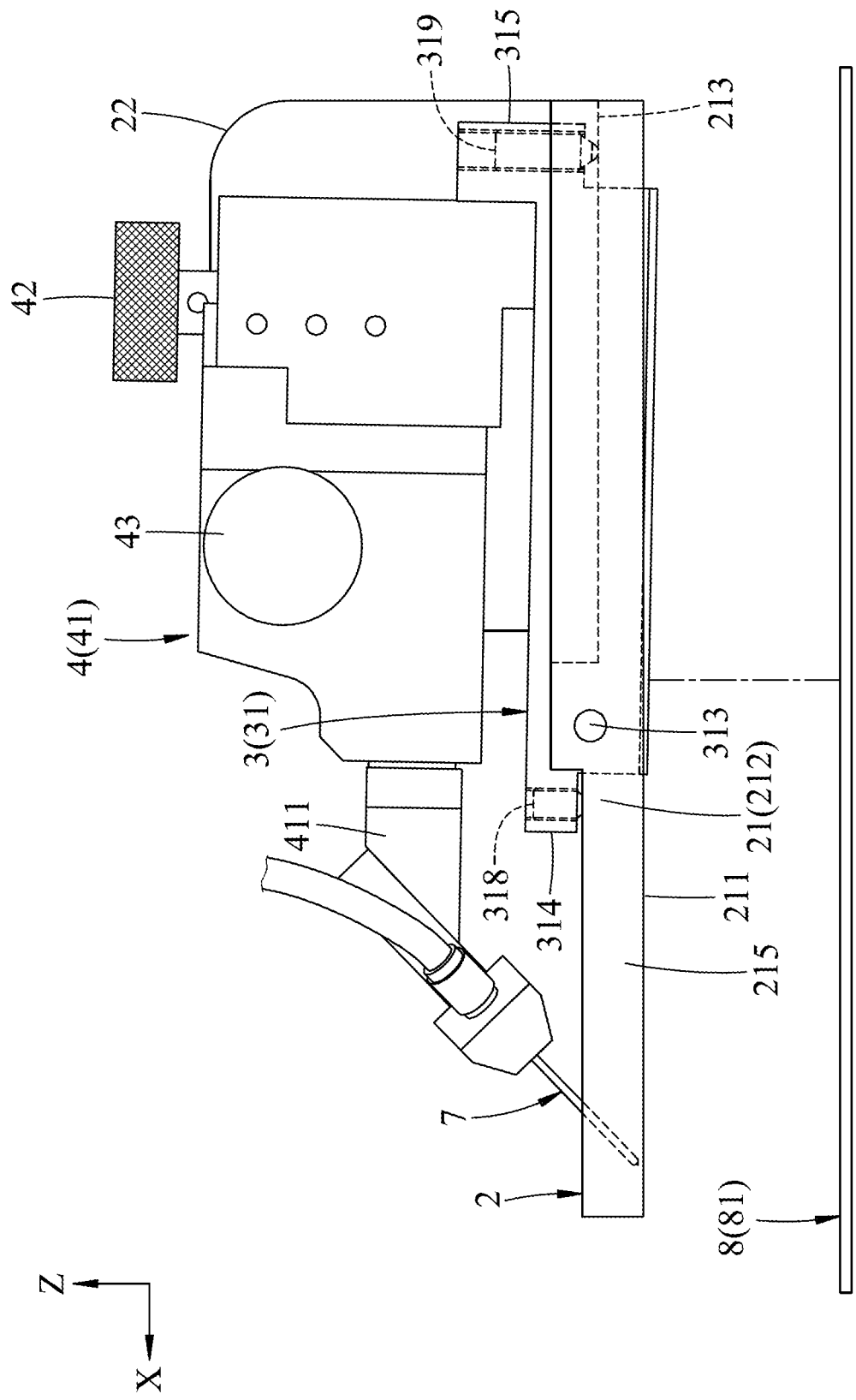
FIG. 8 is a view similar to FIG. 7, illustrating a rear adjustment screw of a movable part of a gravity tilt unit is moved so that an upper limit of an angle of pivot of a rear end portion of the movable part relative to a frame body of a hand-held frame is decreased.

Referring to FIGS. 7 and 8, in the first embodiment, the movable part 31 of the gravity tilt unit 3 further includes a front adjustment screw 318 and a rear adjustment screw 319. The front adjustment screw 318 is threaded movably into the front end portion 314. The rear adjustment screw 319 is threaded threadedly into the rear end portion 315. The front adjustment screw 318 has opposite first and second ends that are respectively proximate to and distal from the front section 212 of the frame body 21, and is movable relative to the front end portion 314 to adjust a distance between the first end thereof and the front section 212 of the frame body 21, thereby adjusting an upper limit of an angle of pivot of the front end portion 314 relative to the front section 212 of the frame body 21. The rear adjustment screw 319 has opposite first and second ends that are respectively proximate to and distal from the rear section 213 of the frame body 21, and is movable relative to the rear end portion 315 to adjust a distance between the first end thereof and the rear section 213 of the frame body 21, thereby adjusting an upper limit of an angle of pivot of the rear end portion 314 relative to the rear section 212 of the frame body 21. Through the utilization of the rear adjustment screw 319 for restricting the inclination of the rear end portion 315, it is possible to prevent the electrical measurement probe 7 from moving out of the measurement through opening 217 and incurring damage. In other variations, the front adjustment screw 318 and the rear adjustment screw 319 can both be omitted, instead, positioning pieces (not shown) are provided on lateral sides of the probe holder 4 for resting on the gripping handle 22 to achieve a similar effect in respect of excessive tilt prevention.

In the first embodiment, the anti-slip strips 23 of the hand-held frame 2 and the non-slip strip 312 of the movable part 31 are silicone films containing electrically conductive filler such as carbon powder. The anti-slip strips 23 and the non-slip strip 312 are provided to increase the friction between the portable probe stand assembly and the surface 81 of the printed circuit board 8 in the usage state, so that damage to the electrical measurement probe 7, scratches to the printed circuit board 8 or electrostatic damage will be prevented when the portable probe stand assembly is moved around on surface 81 of the printed circuit board 8 during measurement. However, in other variations, the anti-slip strips 23 and the non-slip strip 312 can also be omitted; instead, a silicone film may be utilized with the portable probe stand assembly during measurement. The silicone film is put on the surface 81 of printed circuit board 8 beforehand and then the portable probe stand assembly is placed on the silicone film.

The portable probe stand assembly can be hand-held by the gripping handles 22 thus fulfilling manual mobility and provide operational convenience. In addition, with the structural configuration of the slab 311, when the probe holder 4 is in the hand-held state, the underside abutting surface 317 of the movable part 31 will tilt to expose beyond the bottom surface 211 of the frame body 21 through the cut-out 216, and the probe holder 4 will also tilt to bring the electrical measurement probe 7 away from the surface 81 of the printed circuit board 8. This will avoid scratching of the printed circuit board 8 or damaging to the electrical measurement probe 7. Therefore, the present invention possesses the effect of reducing the damage rate with the operation of the portable probe stand assembly; the purpose of the invention can indeed be achieved.

Figure 9:
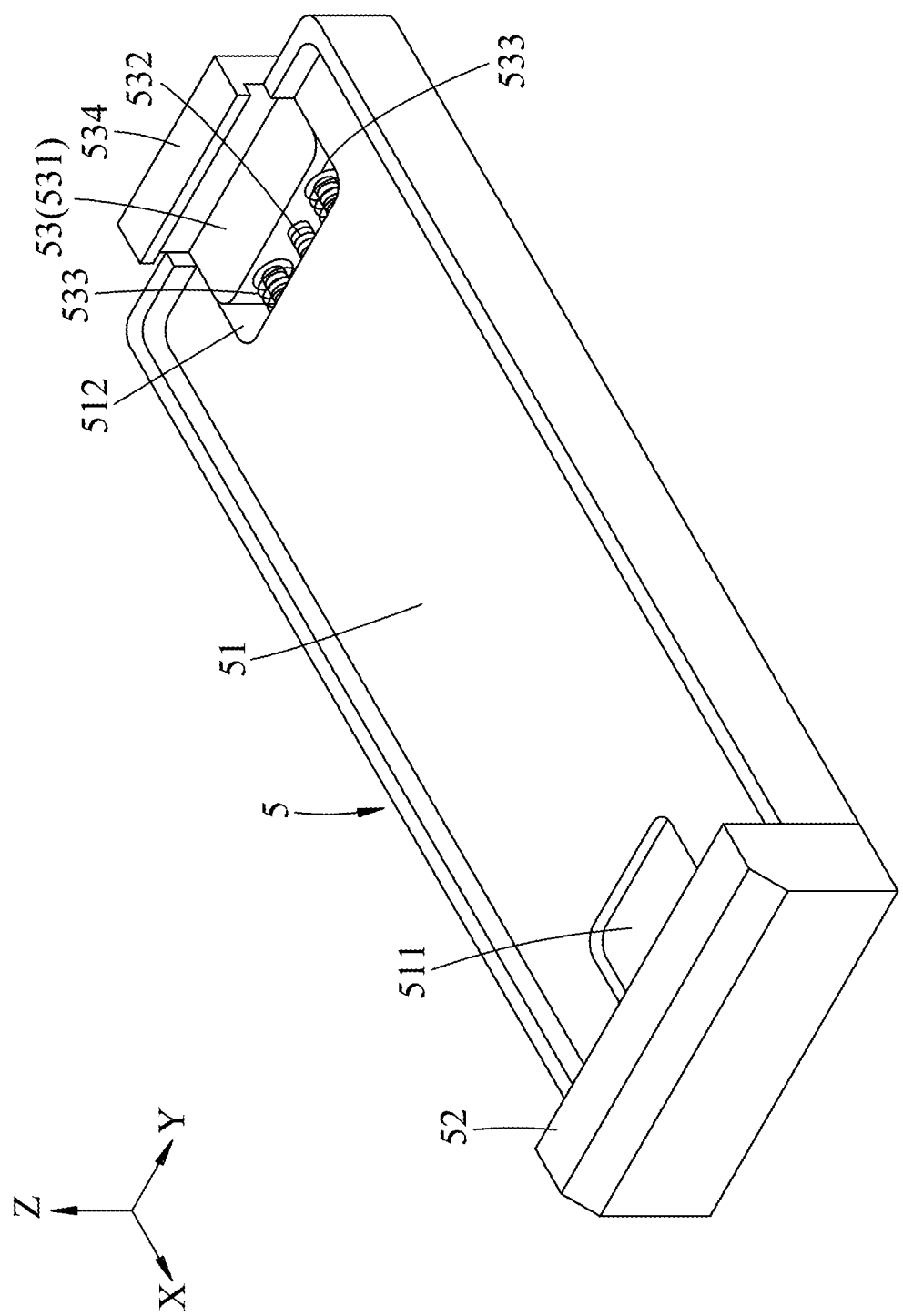
FIG. 9 is a perspective view, illustrating a placement frame of a second embodiment of the portable probe stand assembly according to the disclosure.
Figure 10:
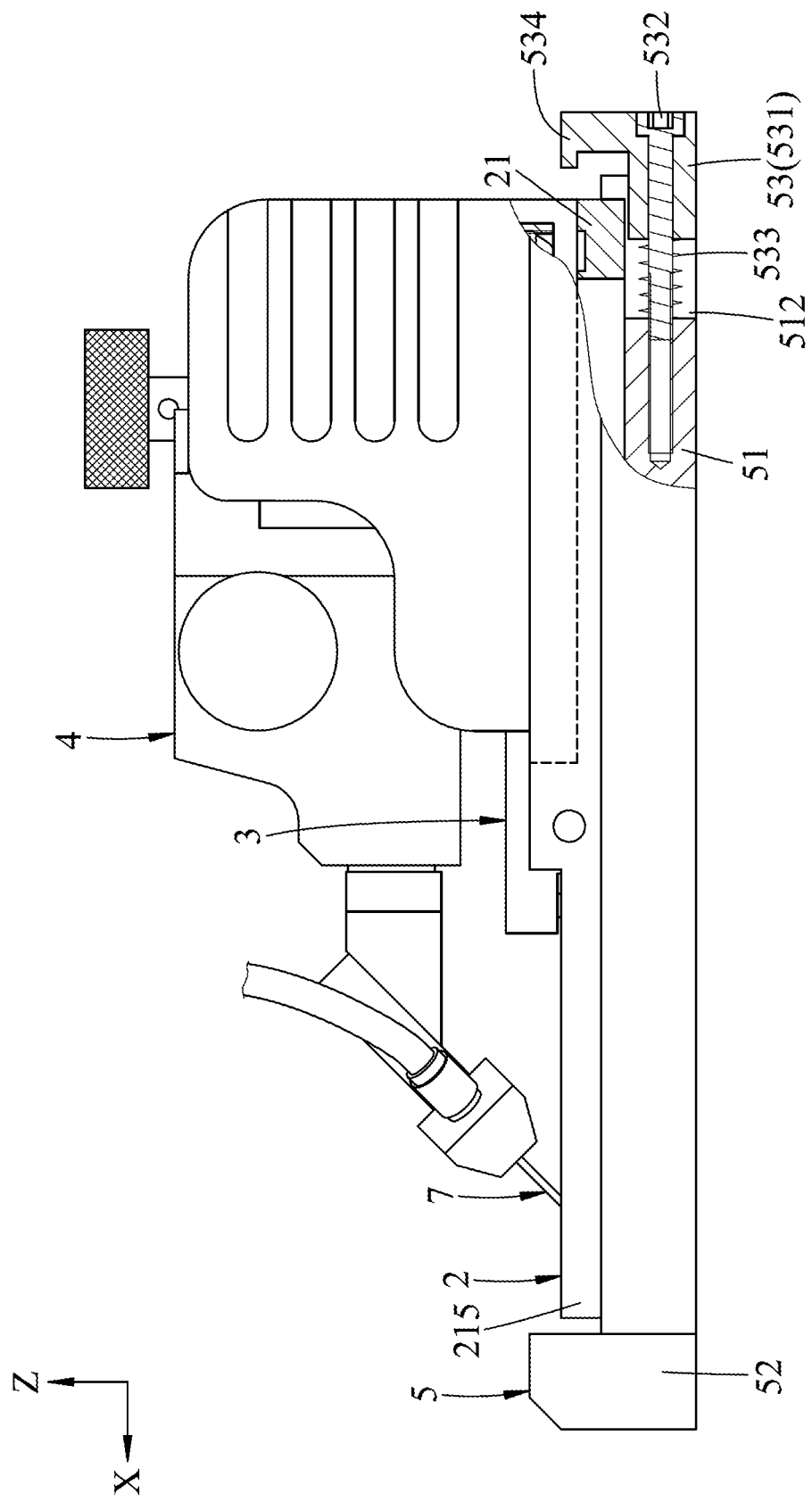
FIG. 10 is a partial cross-sectional view of the second embodiment illustrating the hand-held frame is placed on the placement frame.
Figure 11:
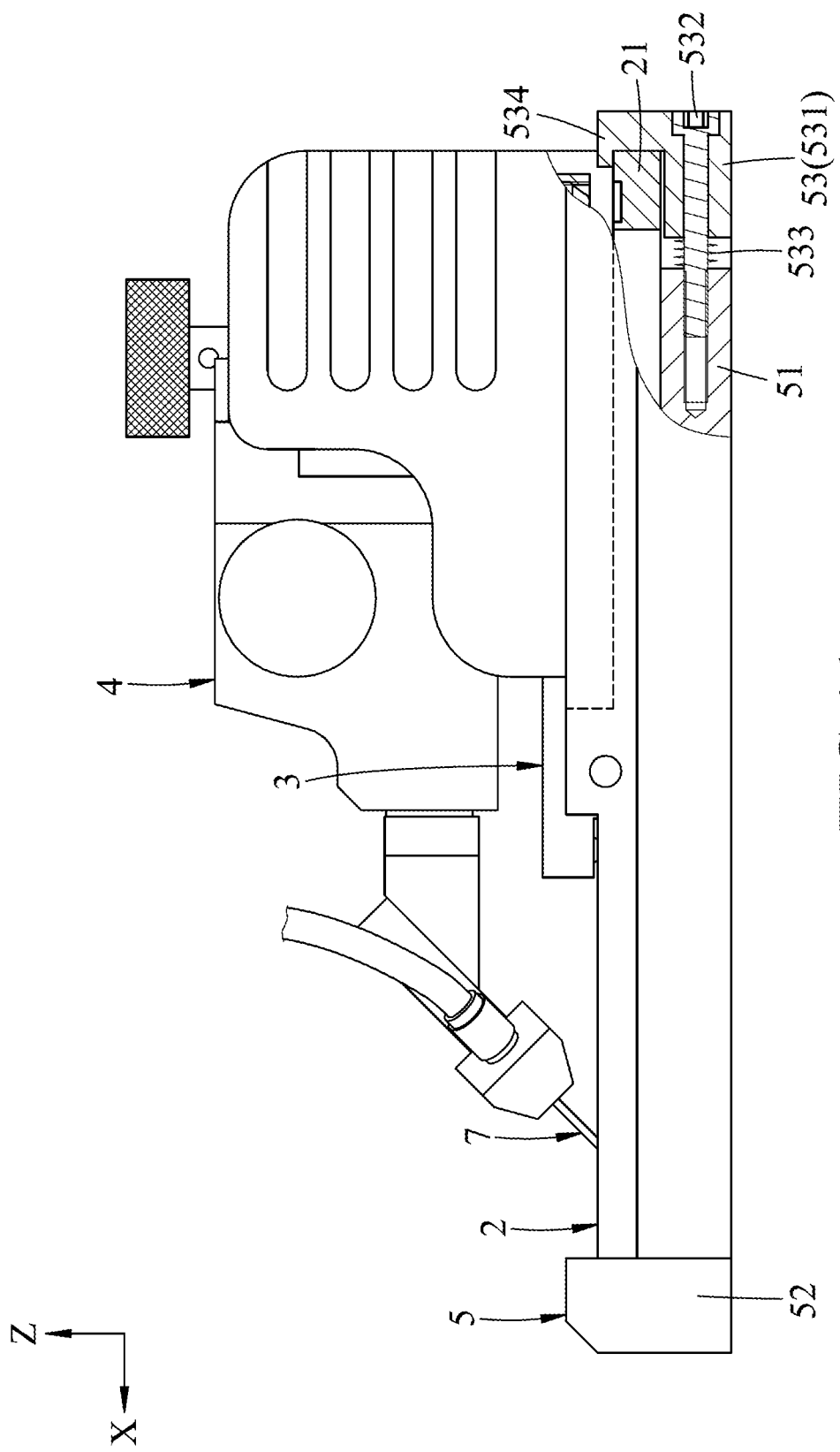
FIG. 11 is a view similar to FIG. 10, illustrating the hand-held frame is fastened by a clamping piece of the placement frame on the placement frame.

As shown in FIGS. 9, 10 and 11, the second embodiment of the portable probe stand assembly according to the disclosure has a structure similar to that of the first embodiment. The main difference between this embodiment and the previous embodiment resides in the following:

The portable probe stand assembly further includes a placement frame 5 for resting the hand-held frame 2. The placement frame 5 includes a base plate 51 extending in the front-rear direction (X) for laying the hand-held frame 2, a fence stop 52 disposed on a front side of the base plate 51 for the frame body 21 of the hand-held frame 2 from falling out from the front side of the base plate 51, and a fastening mechanism 53 disposed on a rear side of the base plate 51 to fasten the hand-held frame 2 so as to maintain the hand-held frame 2 in position.

The base plate 51 has a recess 511 formed on the front side thereof for receiving the electrically measurement probe 7 to prevent the same from hitting the base plate 51, and a hollow out portion 512 formed on the rear side thereof. The fastening mechanism 53 is positioned in the hollow out portion 512 and includes a clamping piece 531, an adjustment member 532, and two resilient members 533. The clamping piece 531 is movable in the front-rear direction (X) and includes an end stop 534. The adjustment member 532 has opposite ends that are threaded respectively into the clamping piece 531 and the base plate 51, and are operable for moving the clamping piece 531 in the front-rear direction (X) relative to the base plate 51 to fasten the end stop 534 onto the frame body 21. The two resilient members 533 are disposed between the base plate 51 and the clamping piece 531 for providing an elastic restoring force to bias the clamping piece 531 away from the base plate 51. In the second embodiment, there are two resilient members 533, in other variations, one or more than three resilient members 533 may be employed.

When there is a need to transport the portable probe stand assembly, the hand-held frame 2 can be placed on the placement frame 5, with the adjustment member 532 being rotated using a hand tool to move the clamping piece 531 toward the fence stop 52 until the end stop 534 of the clamping piece 531 fastens the frame body 21 of the hand-held frame 2, so that damage due to undesired movement of the frame body 21 will be avoided when being carried or transported between operating stations.

Therefore, the second embodiment has the same advantages as those of the first embodiment. Besides, the second embodiment possesses benefits in storage and transportation.

Figure 12:
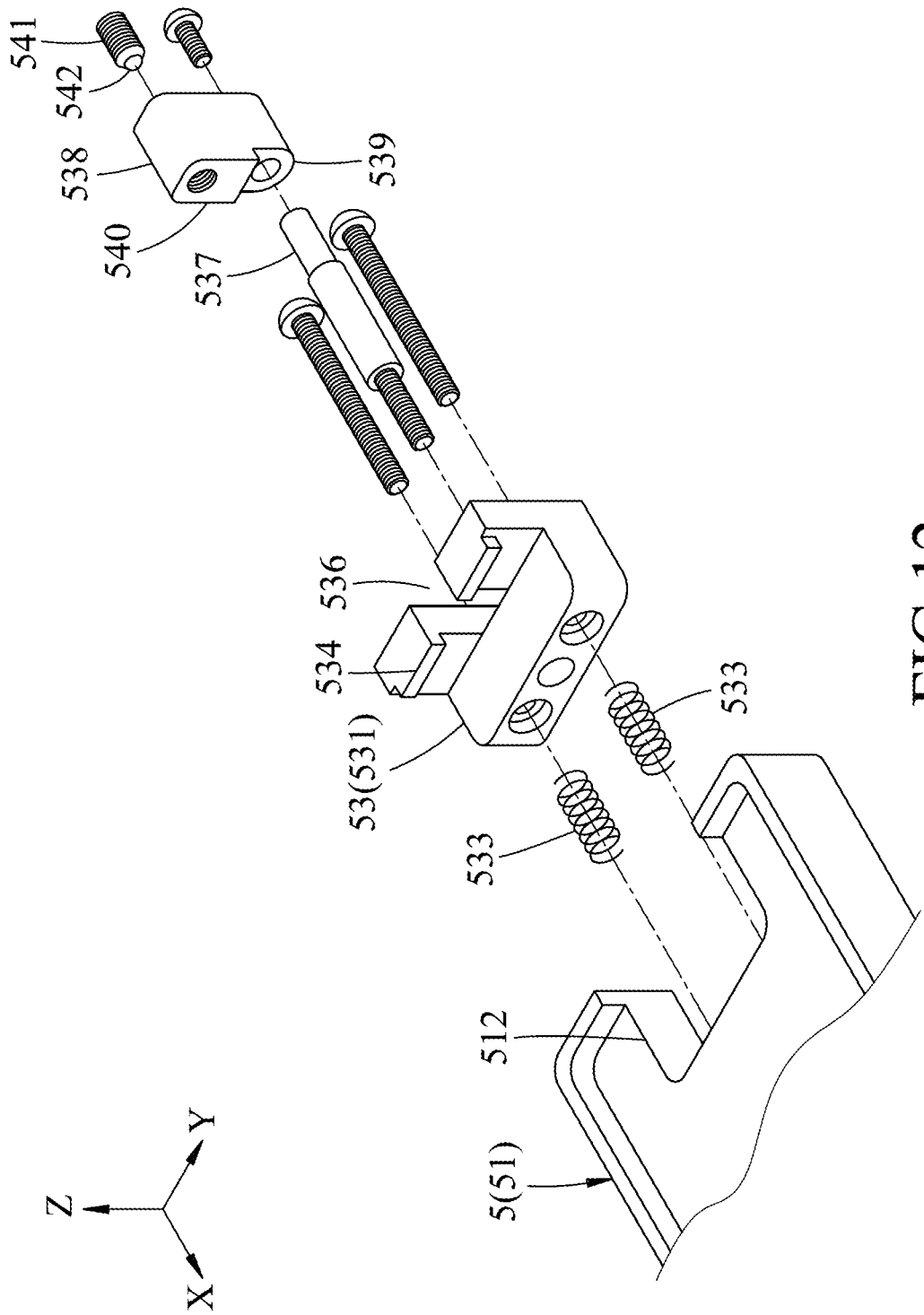
FIG. 12 is a fragmentary exploded perspective view of the placement frame of a third embodiment of the portable probe stand assembly according to the disclosure.
Figure 13:
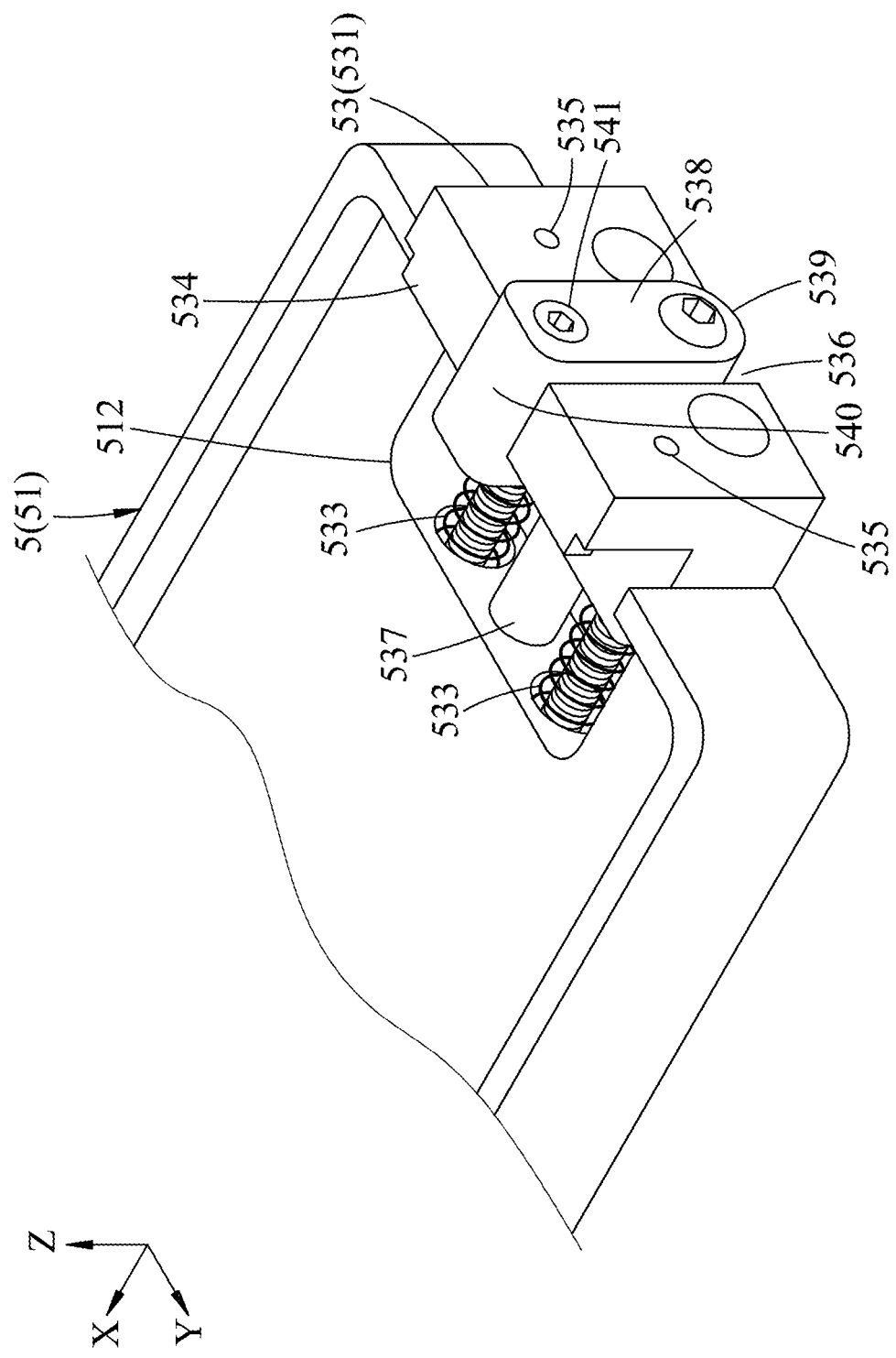
FIG. 13 is a fragmentary assembled perspective view of the placement frame of the third embodiment.
Figure 14:
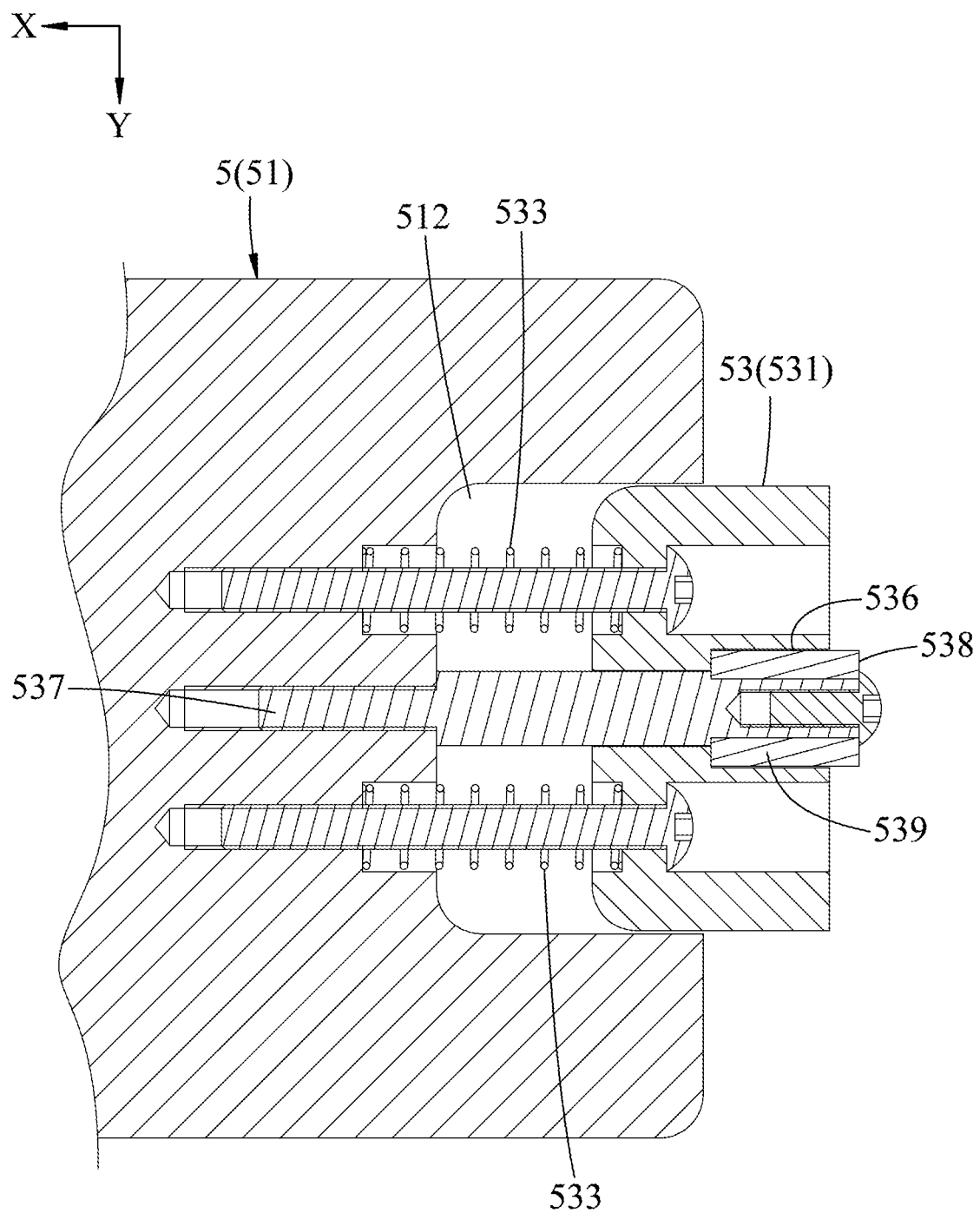
FIG. 14 is a fragmentary cross-sectional view of the placement frame of the third embodiment.
Figure 15:
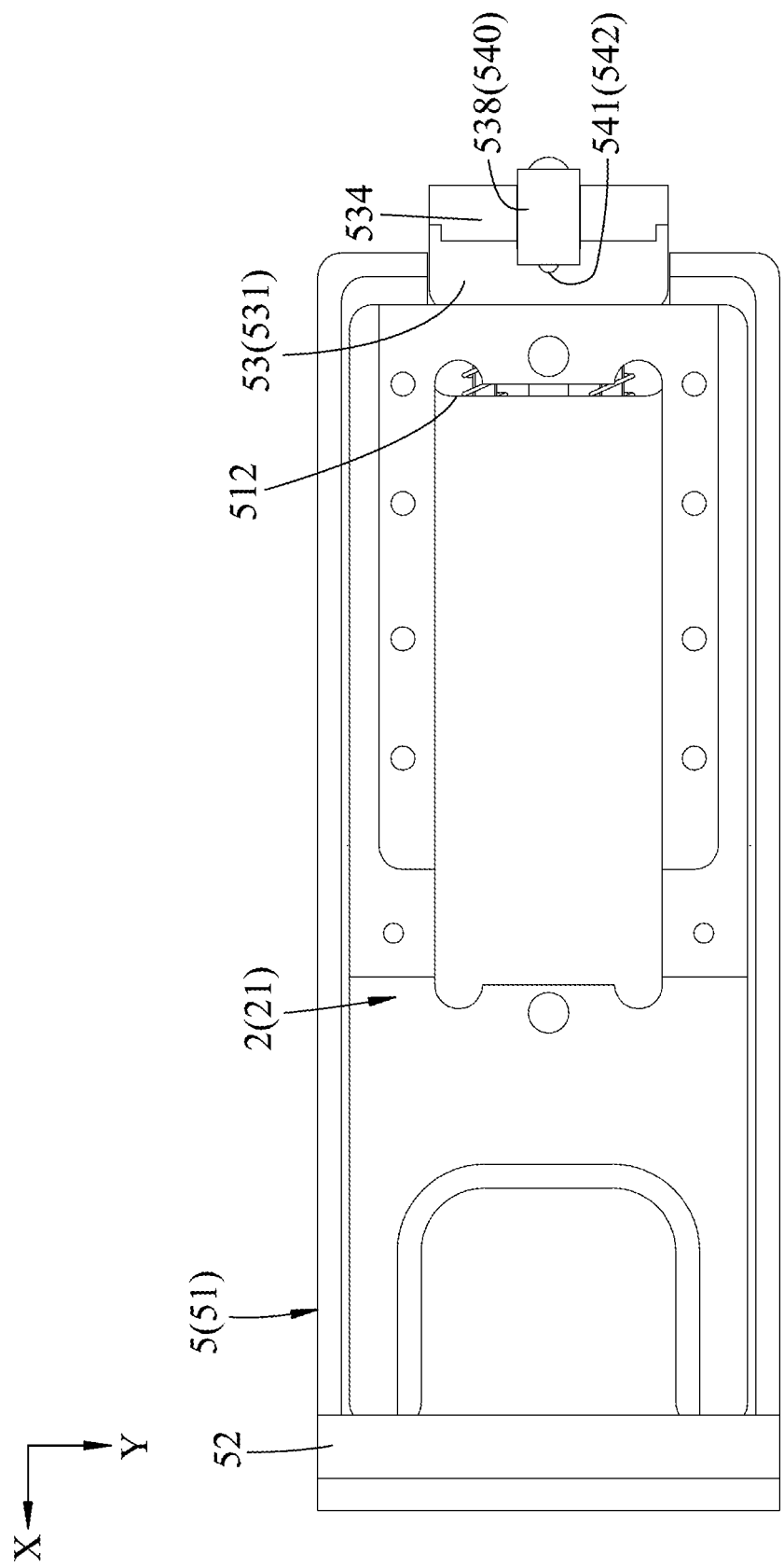
FIG. 15 is a fragmentary top view of the third embodiment, illustrating the clamping piece of the placement frame is spaced apart from the hand-held frame.
Figure 16:
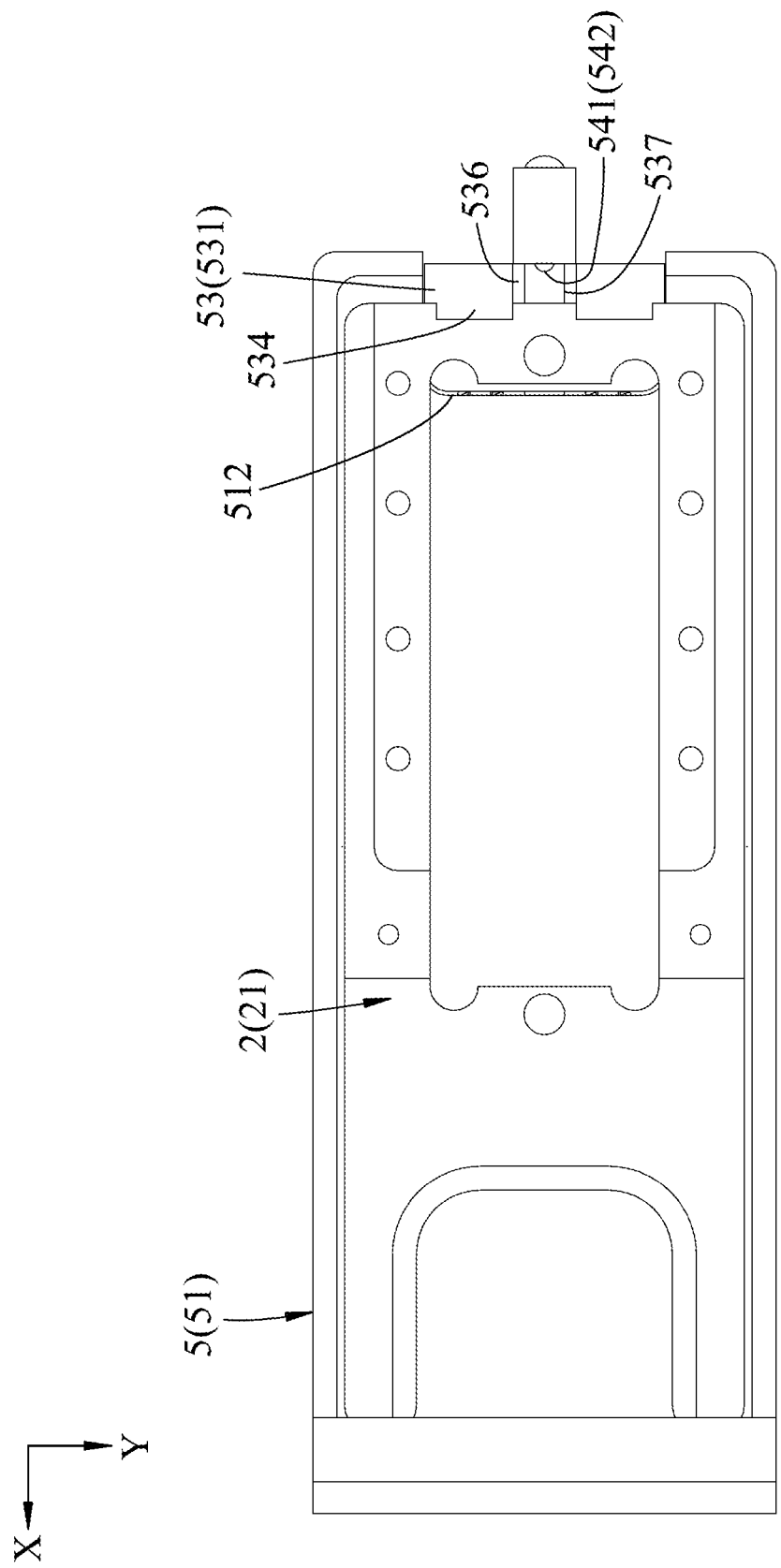
FIG. 16 is a view similar to FIG. 15, illustrating the hand-held frame is fastened by the clamping piece of the placement frame on the placement frame.
Figure 17:
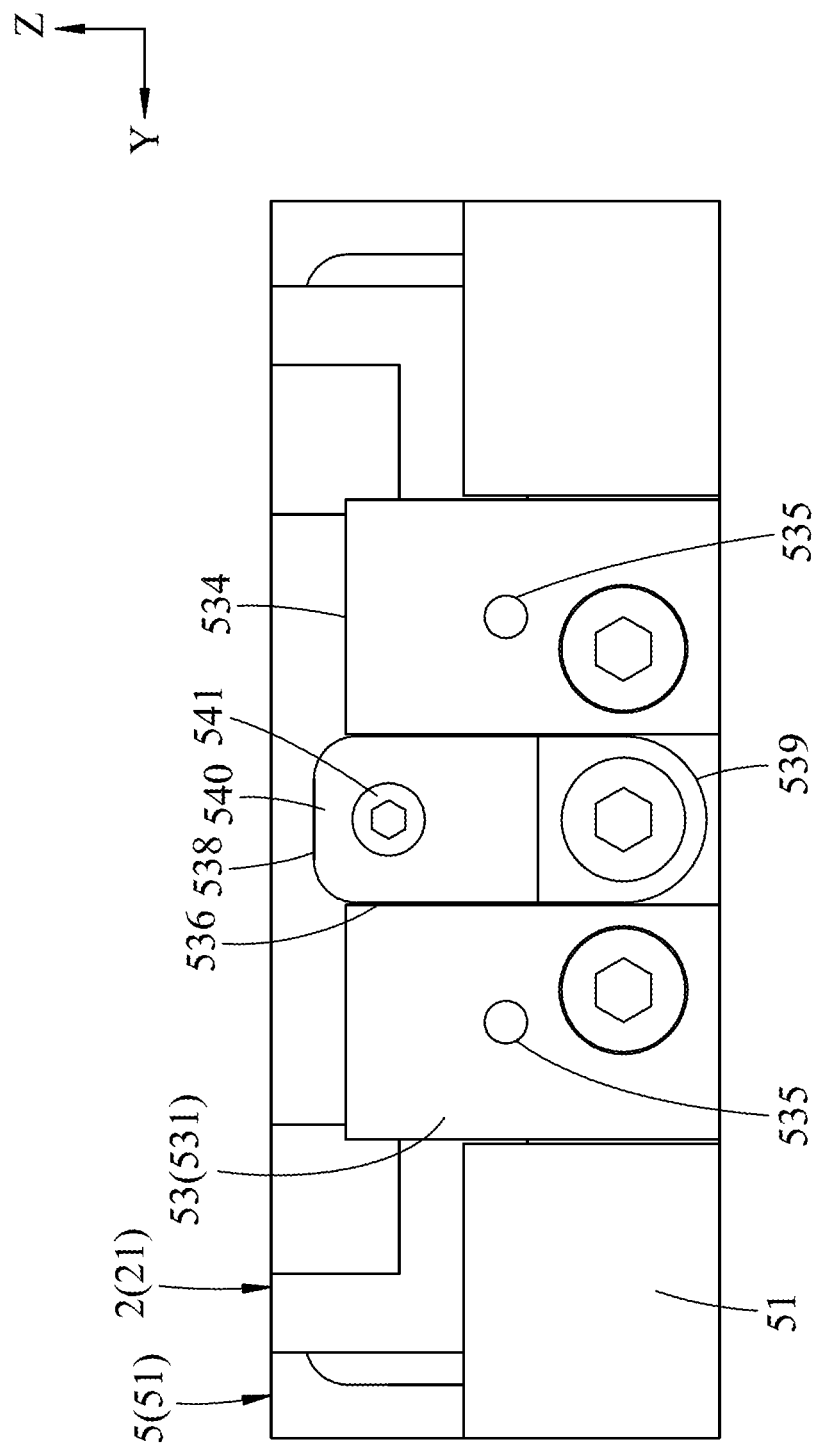
FIG. 17 is a fragmentary rear view of the third embodiment, illustrating a securing member of the placement frame without being pivoted.
Figure 18:
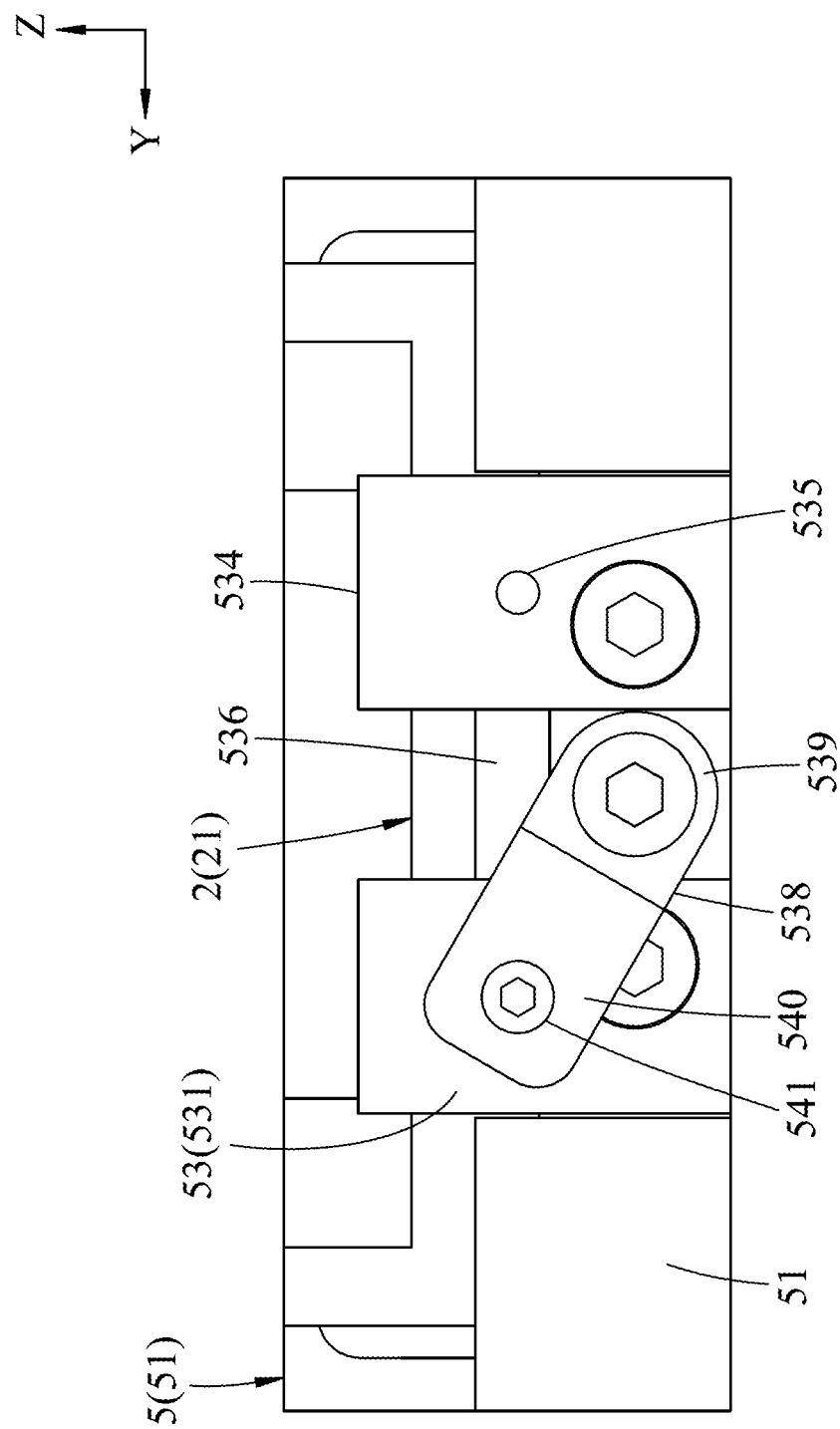
FIG. 18 is a view similar to FIG. 17, illustrating the securing member being pivoted to engage a clamping piece of the placement frame.
Figure 19:
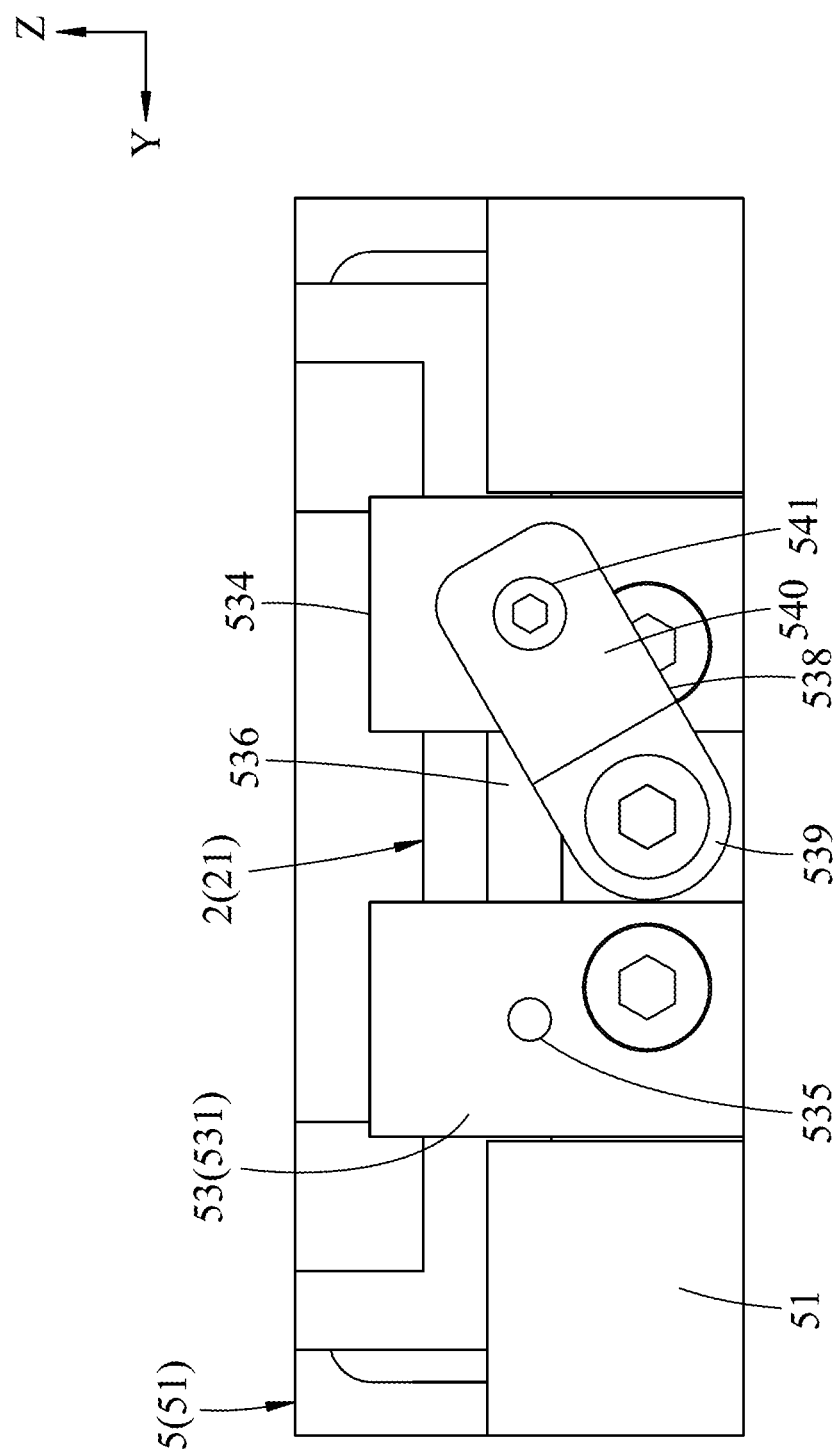
FIG. 19 is a view similar to FIG. 17, illustrating the securing member being pivoted to engage another clamping piece of the placement frame.

As shown in FIGS. 12 to 14, the third embodiment of the portable probe stand assembly according to the disclosure has a structure similar to that of the second embodiment, except for the configuration of the fastening mechanism 53 of the placement frame 5.

In this embodiment, the clamping piece 531 of the fastening mechanism 53 has two first positioning portions 535 that are formed at a rear end of the clamping piece 531, and an engaging slot 536 that is formed between the first positioning portions 535. The adjustment member 532 as disclosed in the second embodiment is omitted. The fastening mechanism 53 further includes a connecting rod 537 and a securing member 538. The connecting rod 537 extends in the front-rear direction (X) through the clamping piece 531 and is inserted into the base plate 51. The securing member 538 is connected pivotally to a rear end of the connecting rod 537 and is disposed in the engaging slot 536 of the clamping piece 531. The securing member 538 has a pivot segment 539 connected rotatably to the rear end of the connecting rod 537 and having a curved bottom end, a swing segment 540 extending upwardly from the pivot segment 539 along the engaging slot 536, and a securing component 541 that is threaded into the swing segment 540. The securing component 541 has a second positioning portion 542 that is formed at a front end thereof and that protrudes from a front end of the securing member 538.

In this embodiment, each of the first positioning portions 535 of the clamping piece 531 is configured as a recess, and the second positioning portion 542 of the securing component 541 is configured as a protrusion. In other embodiments, the configurations of the first and second positioning portions 535, 542 may be interchanged. Moreover, in other embodiments, the second positioning portion 542 may be formed directly at the front end of the securing member 538. In that case, the securing component 541 can be omitted. In addition, the clamping piece 531 may have only one first positioning portion 535 in other embodiments.

Referring to FIGS. 15 to 18, when the hand-held frame 2 is placed on the base plate 51, the clamping piece 531 is move forwardly by the user, against the resilient force of the resilient members 533, along the connecting rod 537 relative to the base plate 51 to fasten the end stop 534 onto the frame body 21 of the hand-held frame 2, such that the securing member 538 is disengaged from the engaging slot 536 of the clamping piece 531. Afterward, the securing member 538 is pivoted to engage the second positioning portion 542 with one of the first positioning portions 535, thereby maintaining the position of the clamping piece 531. When the securing member 538 is pivoted reversely to disengage the second positioning portion 542 from the one of the first positioning portion 535, the clamping piece 531 will be pushed by the resilient force of the resilient members 533 to move rearwardly to once again engage the engaging slot 536 of the clamping piece 531 with the securing member 538, thereby releasing the hand-held frame 2 so that the hand-held frame 2 can be removed from the placement frame 5.

The third embodiment has the same advantages as those of the second embodiment. Furthermore, compared to the second embodiment, the clamping piece 531 of the third embodiment can be easily moved and positioned without using a hand tool.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A portable probe stand assembly comprising:
a hand-held frame including
a frame body that extends in a front-rear direction and that is formed with a cut-out extending therethrough in an up-down direction which is substantially perpendicular to the front-rear direction, and
two gripping handles that are connected to said frame body, that are arranged in a left-right direction which is substantially perpendicular to the front-rear direction and the up-down direction, and that are disposed respectively at opposite sides of said cut-out;
a gravity tilt unit including a movable part that is disposed between and connected to said gripping handles of said hand-held frame, said movable part having a pivot portion that is connected rotatably to said gripping handles and that serves as a pivot of said movable part, a front end portion that is positioned in front of said pivot portion, a rear end portion that is positioned in the rear of said pivot portion, and an underside abutting surface that is disposed under said front end portion, said pivot portion and said rear end portion, a distance between said pivot portion and said front end portion being shorter than that between said pivot portion and said rear end portion such that said movable part tends to pivot due to gravity to a position where a portion of said underside abutting surface under said rear end portion is disposed out of said cut-out of said frame body of said hand-held frame; and
a probe holder supported co-movably on said movable part, and including a probe mount that is disposed higher than said movable part and that projects forwardly;
wherein said portable probe stand assembly being convertible between a hand-held state where said movable part pivots with the portion of said underside abutting surface which is under said rear end portion being disposed out of said cut-out of said frame body of said hand-held frame, and a usage state, where said movable part is leveled via a pivot movement about said pivot portion thereof upon engaging said underside abutting surface with a surface of an object, thereby driving said probe mount to move downwardly.

2. The portable probe stand assembly as claimed in claim 1, wherein said frame body has:
- a front section adjacent to said front end portion of said movable part of said gravity tilt unit;
- a rear section adjacent to said rear end portion of said movable part of said gravity tilt unit;
- two lateral sections spaced apart from each other, connected between said front and rear sections, and cooperating with said front and rear sections to define said cut-out, said gripping handles being connected respectively to said lateral sections; and
- two guard arm sections spaced apart from each other and extended forwardly from said front section.

3. The portable probe stand assembly as claimed in claim 2, wherein:
- said movable part further includes a front adjustment screw threaded movably into said front end portion and a rear adjustment screw threaded movably into said rear end portion;
- said front adjustment screw has opposite first and second ends that are respectively proximate to and distal from said front section of said frame body, and is movable relative to said front end portion to adjust a distance between said first end thereof and said front section of said frame body, thereby adjusting an upper limit of an angle of pivot of said front end portion relative to said front section of said frame body; and
- said rear adjustment screw has opposite first and second ends that are respectively proximate to and distal from said rear section of said frame body, and is movable relative to said rear end portion to adjust a distance between said first end thereof and said rear section of said frame body, thereby adjusting an upper limit of an angle of pivot of said rear end portion relative to said rear section of said frame body.

4. The portable probe stand assembly as claimed in claim 1, wherein said hand-held frame further includes at least one anti-slip strip attached to a bottom surface of said frame body.

5. The portable probe stand assembly as claimed in claim 1, wherein said movable part includes a slab having said front end portion, said pivot portion and said rear end portion, and a non-slip strip attached on a bottom side of said slab and having said underside abutting surface.

6. The portable probe stand assembly as claimed in claim 1, wherein each gripping handle of said hand-held frame has a plurality of ribs formed at intervals at an outer side thereof that is opposite to the other gripping handle.

7. The portable probe stand assembly of claim 1, further comprising a placement frame for resting said hand-held frame thereon.

8. The portable probe stand assembly as claimed in claim 7, wherein said placement frame includes a base plate extending in said front-rear direction for laying said hand-held frame, a fence stop disposed on a front side of said base plate for preventing said frame body from falling out from said front side of said base plate, and a fastening mechanism disposed on a rear side of said base plate to fasten said hand-held frame.

9. The portable probe stand assembly as claimed in claim 8, wherein said base plate of said placement frame has a recess adapted for receiving an electrical measurement probe.

10. The portable probe stand assembly as claimed in claim 8, wherein said fastening mechanism includes:
- a clamping piece movably disposed on said rear side of said base plate, and having an end stop; and
- an adjustment member having opposite ends that are threaded respectively into said clamping piece and said base plate, and operable for moving said clamping piece in the front-rear direction relative to said base plate to fasten said end stop onto said frame body of said hand-held frame.

11. The portable probe stand assembly as claimed in claim 10, wherein said fastening mechanism further includes at least one resilient member disposed between said base plate and said clamping piece for biasing said clamping piece away from said base plate.

12. The portable probe stand assembly as claimed in claim 8, wherein said fastening mechanism includes:
- a clamping piece disposed on said rear side of said base plate, and having an end stop and at least one first positioning portion that is formed at a rear end of said clamping piece;
- a connecting rod extending in the front-rear direction through said clamping piece and inserted into said base plate such that said clamping piece is movable along said connecting rod relative to said base plate to fasten said end stop onto said frame body of said hand-held frame; and
- a securing member connected to a rear end of said connecting rod, having a second positioning portion that is formed at a front end of the securing member, and being pivotable for engaging said second positioning portion with said at least one first positioning portion of said clamping piece so as to maintain a position of said clamping piece.

13. The portable probe stand assembly as claimed in claim 12, wherein said fastening mechanism further includes at least one resilient member disposed between said base plate and said clamping piece for biasing said clamping piece away from said base plate.

* * * * *